US010683777B2

(12) United States Patent
Henry et al.

(10) Patent No.: US 10,683,777 B2
(45) Date of Patent: Jun. 16, 2020

(54) METHOD FOR COATING THE NOSE OF THE CAMS OF A CAMSHAFT WITH DLC, CAMSHAFT OBTAINED IN THIS WAY AND FACILITY FOR IMPLEMENTING SAID METHOD

(71) Applicant: H.E.F., Andrezieux Boutheon (FR)

(72) Inventors: Sandrine Henry, Saint-Paul en Jarez (FR); Christophe Heau, Saint-Etienne (FR)

(73) Assignee: H.E.F., Andrezieux Boutheon (FR)

( * ) Notice: Subject to any disclaimer, the term of this patent is extended or adjusted under 35 U.S.C. 154(b) by 841 days.

(21) Appl. No.: 15/319,644

(22) PCT Filed: Jun. 10, 2015

(86) PCT No.: PCT/FR2015/051528
§ 371 (c)(1),
(2) Date: Dec. 16, 2016

(87) PCT Pub. No.: WO2015/193584
PCT Pub. Date: Dec. 23, 2015

(65) Prior Publication Data
US 2017/0138224 A1    May 18, 2017
US 2017/0298783 A9    Oct. 19, 2017

(30) Foreign Application Priority Data

Jun. 18, 2014 (FR) ..................................... 14 55597
Dec. 30, 2014 (FR) ..................................... 14 63457

(51) Int. Cl.
*F01L 1/16*    (2006.01)
*F01L 1/047*    (2006.01)
(Continued)

(52) U.S. Cl.
CPC .............. *F01L 1/16* (2013.01); *C23C 16/029* (2013.01); *C23C 16/04* (2013.01); *C23C 16/26* (2013.01);
(Continued)

(58) Field of Classification Search
CPC ..... F01L 1/16; F01L 1/047; F01L 2001/0475; F01L 2101/00; F01L 2103/00;
(Continued)

(56) References Cited

U.S. PATENT DOCUMENTS 5,771,873 A * 6/1998 Potter ................. C23C 16/0272
123/668
7,146,956 B2 * 12/2006 Nomura .................. F01L 1/047
123/90.6
(Continued)

FOREIGN PATENT DOCUMENTS

DE    10 2009 053 046 A1    5/2011
EP    2 290 119 A1    3/2011
(Continued)

OTHER PUBLICATIONS

Office Action in Japanese Patent Application No. 2016-573892 dated Jun. 6, 2019 with English translation provided.
(Continued)

*Primary Examiner* — Mark A Laurenzi
*Assistant Examiner* — Loren C Edwards
(74) *Attorney, Agent, or Firm* — Young & Thompson (57) ABSTRACT

A cam treatment to reduce the friction coefficient thereof relative to a counterpart in an area provided with a hard coating made from amorphous Diamond-Like Carbon or DLC, involves disposing the cams on a support, bringing the support and the cams into a chamber placed under vacuum so as to clean the cams, bringing the support into relative movement along a trajectory of travel relative to a coating
(Continued)

source, and taking the cams off the support before assembling them on a camshaft; the method involves disposing the cams on the support in a fixed configuration which is defined in such a way that the cams are brought successively opposite the source with orientations and at distances substantially identical relative to the source, to deposit a hard coating made from amorphous Diamond-Like Carbon or DLC, selectively on the fraction of the section of the cams that is oriented towards the source.

20 Claims, 4 Drawing Sheets

(51) Int. Cl.
| | | |
|---|---|---|
| *F16H 53/02* | (2006.01) | |
| *C23C 16/02* | (2006.01) | |
| *C23C 16/04* | (2006.01) | |
| *C23C 16/26* | (2006.01) | |

(52) U.S. Cl.
CPC ............ *F01L 1/047* (2013.01); *F16H 53/025* (2013.01); *F01L 2001/0475* (2013.01); *F01L 2101/00* (2013.01); *F01L 2103/00* (2013.01); *F01L 2103/01* (2013.01); *F01L 2820/01* (2013.01)

(58) Field of Classification Search
CPC .............. F01L 2103/01; F01L 2820/02; C23C 16/029; C23C 16/04; C23C 16/26; C23C 14/0605; F16H 53/025
USPC ....................................................... 123/90.51
See application file for complete search history.

(56) References Cited

U.S. PATENT DOCUMENTS

| | | |
|---|---|---|
| 2004/0219294 A1 | 11/2004 | Massler et al. |
| 2010/0024592 A1 | 2/2010 | Maurin-Perrier et al. |
| 2013/0209767 A1* | 8/2013 | Kolev .................... C23C 16/54 |
| | | 428/216 |

FOREIGN PATENT DOCUMENTS

| | | |
|---|---|---|
| EP | 2 628 817 A1 | 8/2013 |
| EP | 2 682 230 A2 | 1/2014 |
| JP | S59-205473 A | 11/1984 |
| JP | H05-001769 A | 1/1993 |
| JP | H05-51744 A | 3/1993 |
| JP | H05-306461 A | 11/1993 |
| JP | H06-200451 A | 7/1994 |
| JP | 2000-045717 A | 2/2000 |
| JP | 2009-263762 A | 11/2009 |
| JP | 2011-052238 A | 3/2011 |
| WO | 01/79585 A1 | 10/2001 |
| WO | 2008/047062 A2 | 4/2008 |
| WO | 2009/063788 A1 | 5/2009 |
| WO | 2012/116818 A1 | 9/2012 |
| WO | 2012/156746 A1 | 11/2012 |

OTHER PUBLICATIONS

International Search Report, dated Sep. 24, 2015, from corresponding PCT Application.

* cited by examiner

METHOD FOR COATING THE NOSE OF THE CAMS OF A CAMSHAFT WITH DLC, CAMSHAFT OBTAINED IN THIS WAY AND FACILITY FOR IMPLEMENTING SAID METHOD

BACKGROUND OF THE INVENTION

Field of the Invention

The invention relates to a method for coating the cams of a camshaft, a cam obtained in this way, a camshaft obtained in this way and a facility for implementing the method. Thus, it relates to the application of hard coatings on mechanical components, such as cams, with the aim of reducing the mechanical stresses induced by contact with the opposing part, typically a finger follower, a tappet or a rocker arm. It relates quite particularly to the field of internal combustion engines, for cars, motorcycles or heavy goods vehicles, utilizing camshafts.

In the case of cam/finger follower and cam/tappet contacts, treatment of the finger follower (or of the tappet), in particular by a coating of the DLC type, is known to a person skilled in the art. It is noted that the acronym DLC denotes a hard coating based on amorphous carbon ("diamond-like carbon"). The advantage of applying this type of coating is that it reduces the coefficient of friction between the cam and the finger follower or the tappet, and thus reduces the fuel consumption and the carbon dioxide ($CO_2$) emission of the vehicle. Application of such a coating has become necessary because of the ever increasing contact pressure between these components (this increase in contact pressure results from the growing trend to reduce the size of the components in order to reduce their mass and the energy lost through inertia).

However, despite the excellent friction properties of the DLC coatings, it was found that the use of certain oils with additives (i.e. containing additives), in combination with DLC coatings, sometimes led to unsatisfactory results in terms of wear resistance and reduction of friction. This is the case in particular when utilizing oils containing friction-reducing additives based on sulphur and molybdenum such as MoDTCs (molybdenum dithiocarbamates); an advantage of these MoDTCs is that a tribo-chemical reaction leads to the formation of a protective film, also called a tribofilm, on the metallic surfaces present, typically the surface of the cams in a cam/finger follower or cam/tappet system. Now, it was found that an undesirable chemical reaction occurred between the complex elements of this tribofilm (formed on the cams) and the DLC coating applied on the finger follower (or the tappet), which leads to accelerated degradation of the coating, also called tribocorrosion.

As the tribofilm only forms on bare, i.e. uncoated, metallic surfaces or on coatings with a highly metallic character (i.e. formed from metallic elements to a large extent), a solution consists of coating the two opposing parts, i.e. the cam and the finger follower (or the tappet), with a coating that does not allow this tribofilm to form, for example with DLC. In the absence of tribofilm in the contact zone, no chemical reaction can take place between the additives and the DLC coating. The latter can then fulfil its function of reducing friction without deterioration owing to the presence of the MoDTCs.

Description of the Related Art

Such camshaft coating was already envisaged some year ago. However, until now, the cost associated with coating a camshaft has had the effect of restricting the application of DLC coating on a camshaft to the field of motor racing alone (Formula 1 in particular), the cost being regarded as prohibitive in the field of automobile manufacture in general.

The high cost of coating a camshaft results in particular from the fact that such a camshaft is very bulky, so that it is not possible to treat a large number of camshafts simultaneously; moreover, the complexity of the shape of a camshaft makes treatment thereof complex.

However, it became clear that the zones of a camshaft that are really useful in interaction with the finger followers or the tappets represent a small fraction of the total surface area (less than 25%), so that it seems superfluous to coat the entire surface of a camshaft. When this is considered in conjunction with the fact that camshafts are already known resulting from assembly of a shaft and a plurality of cams, it may be envisaged to provide a protective coating on the cams of a camshaft only, provided it is then possible to incorporate these cams into a camshaft in such a way as to avoid causing any deterioration of this coating.

However, the cost reduction made possible by the fact of treating only the cams of a camshaft does not seem to be sufficient to reduce the costs to within a range that allows general application of the treatment of camshafts.

An alternative seems to consist of developing a coating of the DLC type that has chemical resistance to additives of the MoDTC type contained in these new-generation oils; in this connection, reference may be made to document WO 2012/116818 A1. However, this alternative then generates an additional source of cost, reducing the economic advantage resulting from coating only a part of the camshafts.

BRIEF SUMMARY OF THE INVENTION

The invention aims to treat a camshaft by means of a protective coating, such as a DLC coating, at low enough cost to allow large-scale general application of such a treatment in the field of automotive propulsion broadly understood (including not only automobiles, but also motorcycles and heavy goods vehicles), while allowing good friction performance to be maintained against parts that have also been treated with such a protective coating, such as DLC, even in the presence of oils comprising additives such as MoDTC.

For this purpose, the invention proposes a method for treating the cams of a camshaft for a vehicle with an internal combustion engine to reduce its coefficient of friction with respect to an opposing part in a zone provided with a hard coating based on amorphous carbon of the diamond-like carbon or DLC type, according to which the cams are arranged on a carousel so as to align their lengths along the radii of this carousel according to a fixed configuration between the cams and the carousel in which all the cams carried by this carousel are at one and the same distance from the axis of rotation of the carousel with their noses oriented towards the outside of the carousel; this carousel and the cams being placed in an enclosure that is put under vacuum so as to ensure cleaning of these cams, this carousel is rotated about its axis with respect to a coating source so as to deposit a hard coating based on amorphous carbon of the diamond-like carbon or DLC type, selectively on the fraction of the section of the cams that is oriented towards the outside of the carousel, and the cams are removed from the carousel before assembling them on a camshaft.

Conventionally, deposition under vacuum is in particular physical deposition (PVD: physical vapour deposition) or chemical deposition (PACVD: plasma-assisted chemical vapour deposition), in particular.

Since a rotation about an axis at infinity becomes a translation, it will be understood that the invention is generalized to the case where the cams are arranged in such a way that their lengths are oriented parallel to one another, perpendicularly to a path of relative travel with respect to the coating source.

Moreover, the invention is generalized to the case where, instead of being horizontally opposite the cams (and vice versa), the coating source is above (or below) the cams, with for example rotation about a horizontal axis, or translation of the cams below, or above, the coating source, or even in the case where the cams are opposite the source, inclined in any direction; now, such configurations were hardly realistic in the configurations of the state of the art.

Thus, very generally, the invention proposes a method for treating the cams of a camshaft for a vehicle with an internal combustion engine to reduce their friction with respect to an opposing part in a zone provided with a hard coating based on amorphous carbon of the diamond-like carbon or DLC type, these cams having a section with a circular zone and an elongated portion forming a nose, while having a length defined by the maximum dimension measured from their nose to the circular zone, according to which the cams are arranged on a support, this support is brought into a chamber that is put under vacuum so as to ensure cleaning of the cams, this support is put in relative motion following a path of travel relative to a source of a hard coating material based on amorphous carbon of the diamond-like carbon or DLC type, and these cams are removed from the support before they are assembled on a camshaft, characterized in that the cams are arranged on the support according to a fixed configuration, this fixed configuration and this path of travel being defined in such a way that these cams are brought successively opposite the coating source with substantially identical orientations and at substantially identical distances with respect to said source, so as to deposit a coating selectively on the fractions of the sections of the cams that are oriented towards said source.

A path of travel can be defined as the line drawn through a point arbitrarily chosen within the support during its travel in front of the source during the relative motion; it will be understood that it is therefore possible to define a plurality of trajectories of travel depending on the chosen points but that these various trajectories are parallel so that it is possible to define the orientation of the cams with respect to such a path of travel without having to specify the point arbitrarily chosen.

Hereinafter, the support is denoted a tray when it is formed from a flat plate, usually horizontal, or from an assembly of one or more parallel plates, which may be vertical. In the case where such a tray or such an assembly is rotated, it can be denoted by use of the term carousel.

It is implicit herein that the coating in question has a thickness of the order of a micron (not more than a few microns), which corresponds to what is called a thin film. It therefore follows that the methods for depositing such a coating are methods for forming thin films.

It is noted that the section of a cam denotes the zone, narrow in practice, which is delimited by the parallel faces of this cam. The invention does not require precautions to be taken to avoid depositing the coating material on these parallel faces. The nose represents the most tapered part of the section of the cam, in practice farthest from the opening that such a cam usually has, which explains why the length of a cam is measured between this nose and the circular zone comprised by its section.

The invention takes advantage of the fact that, in the final analysis, only a part of the section of a cam needs to be provided with a protective coating such as DLC, which allows considerable simplification of the conditions for forming such a coating, in combination with an increase in the number of cams that can be treated simultaneously, for given treatment conditions, in a given volume.

In fact, the invention takes advantage of the fact that it is sufficient in practice to coat just the nose of the cams, or even just a part of these noses, to avoid deterioration of the coating of the opposing part, even in the presence of an oil, such as an oil containing MoDTCs. More specifically, it was found to be unnecessary to coat the part of the cam (commonly called heel) that is at a minimal distance with respect to the axis of rotation of the cam; even if in service this part sometimes comes into contact with the opposing part in the presence of an oil containing MoDTCs, this contact does not take place in practice with sufficient pressure for the presence of a tribofilm on the surface of the uncoated zone to promote the reaction of degradation of the DLC.

Now, it appears that this zone at minimal distance from the axis of rotation of the cam extends in practice over an angle of the order of 180° about this axis, which means that to coat a cam outside of this zone at minimal distance, it is not necessary to provide rotation of this cam on the carousel used conventionally for forming a protective coating. However, it will be understood that the invention does not require particular measures to be taken to avoid depositing the coating material beyond the zone of friction; it is even conceivable that material could be deposited beyond this zone of friction with the opposing part.

In fact, usually, for forming a coating on a component from a source of coating material, this component is arranged on a carousel, which is itself mounted on a rotating tray designed to present its periphery opposite said source in a vacuum deposition machine; on this rotating tray, several carousels are mounted, controlled in rotation about their respective axes, parallel to the axis of the tray, giving their rotation a planetary character; and each component mounted on each carousel is capable of turning on this carousel so as to present each zone of its periphery to the source. This means that there is a combination of three rotational movements (rotation of the components with respect to their carousel, rotation of this carousel with respect to the tray and rotation of the tray in the machine). These rotations take place conventionally about vertical axes.

Since, according to the invention, exposing the whole of the section of the cams to the source is not required, it is no longer necessary to provide rotation of the components about their axis (as a person skilled in the art would do), which makes it possible to reduce the number of rotations (or movements) to be controlled. This is a first simplification, which produces a cost reduction.

Moreover, since it is no longer necessary to provide rotation of the components with respect to their support, it becomes possible to arrange the components to be treated, on a given support, far more densely than in the case of triple rotation; it follows from this that during a treatment phase it is possible to treat an increased number of components, which constitutes another reason for cost reduction.

Finally, since only a part of the section of the components is coated, there is a reduction in the quantity of coating material, which constitutes another reason for cost reduction.

However, in practice, there could be doubts over the fact that a coating on just a part of the surface of the sections of the cams would have satisfactory adhesion in service, without undergoing deterioration during assembly of the cams on a camshaft (as stated above, it is a question of simple thin films). It was found, however, that this did not have any significant consequence (provided of course that the coating is deposited with the usual care).

It should be emphasized that the treatment of cams according to the invention, when a rotational movement about a vertical axis is chosen, does not involve a significant change in the coating facility, except that the construction of the carousels is simplified, by removing the third rotation therefrom.

on the contrary, the invention allows the main movement to be a translation and no longer necessarily, a rotational movement (about an identifiable axis), in which case, as the path of travel is rectilinear, the cams are arranged on this support so as to align their lengths parallel to one another, while being at one and the same distance from this path of travel. Even more generally, the path may be a combination of rectilinear portions and circular portions.

Moreover, according to the invention, the source need no longer necessarily be horizontal with respect to the cams; thus, the cams may travel horizontally above or below the source, or even in another direction in front of the source.

It is noted that with respect to a document such as DE 10 2009 053 046, the invention is distinguished in that, although this document mentions the fact of forming a DLC coating on only a part of cams, nowhere therein is it described or suggested to selectively coat the nose of the cams, or even only a fraction thereof. It is understood in this document that this coated part may be limited to the sliding zone, i.e. the entire section of the cams; in fact, it is explained that the coating is obtained by arranging the components on a mandrel, which is then put in a furnace, the components being arranged adjacently so that the coating only forms on the sliding surface or the outer surface of these cams (it is recommended that the central opening of the cams should not itself be coated); this document neither describes nor suggests forming the coating on the nose of the cams at most, or even on only a fraction thereof; in any case, it neither describes nor suggests how to obtain such a result.

Similarly, with respect to a document such as EP 2 682 230, the invention is distinguished by the fact that, although this document mentions the fact that cams may only have a coating of amorphous carbon on some zones of their surfaces, this document neither describes nor suggests limiting such a coating to the nose, or even only a fraction of this nose. In fact, this document relates to the formation of a microstructure on the surface of the cam, so as to be able to trap lubricant, and it is only by generalization without the slightest specific information that it is mentioned that the coating thus modified may itself also be limited to zones of the cam. This document neither describes nor suggests coating a single zone of the cams (all or part of the nose) and does not contain any precise information for obtaining such a result.

Preferably, as the cams have a central opening, they are arranged, in the case of a rotational movement, on a carousel by passing through the openings, rods positioned parallel to the axis of the carousel and arranged at one and the same distance from this axis, these rods having a regular angular distribution about this axis so that the cams engaged on a rod are at least approximately in contact with the cams engaged on the nearest rods; more generally, the rods are arranged parallel to one another at one and the same distance from the path of travel so as to be oriented perpendicularly to the direction of emission of the coating source when they are brought opposite thereto, while being distributed regularly along the latter so that the cams engaged on a rod are at least approximately in contact with the cams engaged on the nearest rods. In practice, it may be considered that the cams are at least approximately in contact with the cams engaged on an adjacent rod when the space between these cams does not exceed 20%, or even 10% of their diameter. It will be appreciated that this allows precise, dense positioning of the cams on a support such as a tray or a carousel.

Preferably, masks are arranged on the carousel, all arranged at one and the same distance with respect to the axis of the carousel, which is greater than or equal to that at which the rods are located with respect to this axis, alternating circumferentially with these rods, so as to mask, with respect to the deposition source or sources, the zones of the cams where their sections are opposite the adjacent cams; more generally, the masks are arranged at one and the same distance with respect to a surface defined by the set of rods during their relative movement with respect to the source, while alternating with these rods, so as to be in front of these rods in the direction of the source when the rods and the cams that they serve to position arrive opposite the source, so as to mask, with respect to the source, the zones of the cams where their sections are opposite the adjacent cams. It may be noted that the presence of such masks allows the coated zones to be delimited precisely. It will be understood that the masks can only be located in the surface defined by the rods during their movement if the cams mounted on these rods are not circumferentially in contact with the adjacent cams (in other words, the cams are only approximately in contact in this case).

Preferably, the masks have, circumferentially or parallel to the surface defined by the rods during their movement, a dimension extending from the surface of the cams engaged on a rod to the surface of the cams engaged on an adjacent rod, give or take clearance; this detail helps to optimize the precision with which the coated zone of each cam is delimited.

Preferably, in the case of a support formed by a rotating carousel, the distance to the axis of rotation of the masks has a value of between 100% and 150% of the distance of the axis of the rods with respect to this axis of rotation; this delimits fractions of the surface of the nose that are large enough to contain the zones where the cam bears appreciably on the opposing part, but small enough so that they can be obtained easily. Advantageously, this distance to the axis of the masks has a value of 110% to 130% of this distance to the axis of the rods.

Preferably, the carbon-based coating is deposited with a composition containing from 20 to 50 at % of hydrogen, preferably from 20 to 30 at % of hydrogen; in fact, it is advantageous for the DLC coating to contain hydrogen, which offers the advantage that the coating formed has low roughness; in fact, deposits of carbon without hydrogen are obtained in practice by arc technology and may in consequence display considerable roughness at the end of deposition, and it is necessary in certain cases to subject them to an operation of post-coating polishing, which cannot be economically beneficial. In practice, layers of non-hydrogenated amorphous carbon display good durability under abrasive wear; however, layers of hydrogenated amorphous carbon a-C:H, the durability of which under abrasive wear is a little poorer, have less limitation on thickness.

Preferably, before depositing the carbon-based coating, a sub-layer is formed of tungsten carbide or nitride, chromium carbide or nitride or a mixture of tungsten and chromium carbides and/or nitrides, or any other layer or combination of layers known to a person skilled in the art for providing adhesion of a DLC coating on a metallic substrate. This often occurs in practice, since it is known that a DLC layer in itself has low adhesion with respect to a large number of substrates, in which case the presence of a priming coat is necessary.

Advantageously, before or after application of the DLC coating, a surface microtexture is formed on all or part of the surface of the nose of the cams; this makes it possible to optimize lubrication, by making it possible in particular to reduce the time required to reach elasto-hydrodynamic conditions of the of cams and opposing parts as a whole, i.e. normal behaviour in continuous service.

The invention also relates to a cam obtained by the aforementioned method, i.e. a cam for which only a part of the section is provided with a coating based on amorphous carbon DLC.

By analogy, the invention covers a shaft comprising cams obtained by the aforementioned method, i.e. a camshaft comprising cams of which only a part of the section, representing at most the nose of these cams, is provided with a coating based on amorphous carbon (diamond-like carbon); it is in this configuration that the invention is fully effective.

Preferably, the sections of the cams are only provided with said coating up to a distance, with respect to the ends of the circular zone of these cams, that has a value of at least 20%, or even 30%, of the radius of this circular zone of these cams; this contributes towards ensuring that the coating is only present, to a significant thickness, on a zone of the section of the cams where it is genuinely useful.

Advantageously, these cams are microtextured in all or part of the zone of the section provided with said coating.

By analogy, the invention covers a motorization assembly comprising a camshaft of the aforementioned type and a plurality of tappets (or finger followers) interacting respectively with these cams, each of these tappets (or finger followers) having a contact surface provided with a carbon-based (diamond-like carbon) coating; it will be understood that it is in operation that a camshaft the cams of which have been treated by the aforementioned method becomes useful.

According to another aspect, the invention proposes the use of a camshaft of the aforementioned type with a plurality of tappets (or finger followers) interacting respectively with these cams, each of these tappets (or finger followers) having a contact surface provided with a carbon-based (diamond-like carbon) coating, in the presence of an oil containing friction-reducing additives based on sulphur and molybdenum, in particular MoDTC compounds; this means expressing the conditions under which the invention overcomes the drawbacks of complete absence of a coating on the cam.

According to another aspect, the invention proposes a coating treatment facility for implementing the aforementioned method, comprising a source for vacuum deposition of a coating material, a carousel able to turn about an axis of rotation so as to present its periphery opposite this source, this carousel comprising a plurality of rods parallel to its axis, these rods being fixed with respect to this carousel, being distributed regularly about the axis at one and the same distance from this axis while having an angular spacing to allow cams of a predetermined format to be engaged on these rods while being oriented radially with their nose pointing to the exterior of the carousel; this means expressing the invention in terms of means for implementing the aforementioned method.

In general, this facility can be defined as comprising a source for vacuum deposition of a coating material, and a support capable of being moved in front of this source following a path of relative travel, this support comprising a plurality of rods parallel to one another, fixed with respect to this tray while being distributed regularly at one and the same distance from the path of travel so as to be oriented perpendicularly to the direction of emission of the source of coating material when they are brought opposite thereto, having a spacing between them that allows cams of a predetermined format to be engaged on these rods, while being oriented according to one and the same configuration with respect to the path of travel while having their nose oriented towards the source when they arrive opposite this source.

BRIEF DESCRIPTION OF THE DRAWINGS

Aims, characteristics and advantages of the invention will become apparent from the following description, given with reference to the attached drawings, which are for non-limitative illustration purposes only, in which.

DETAILED DESCRIPTION OF THE PREFERRED EMBODIMENTS

Figure 1:
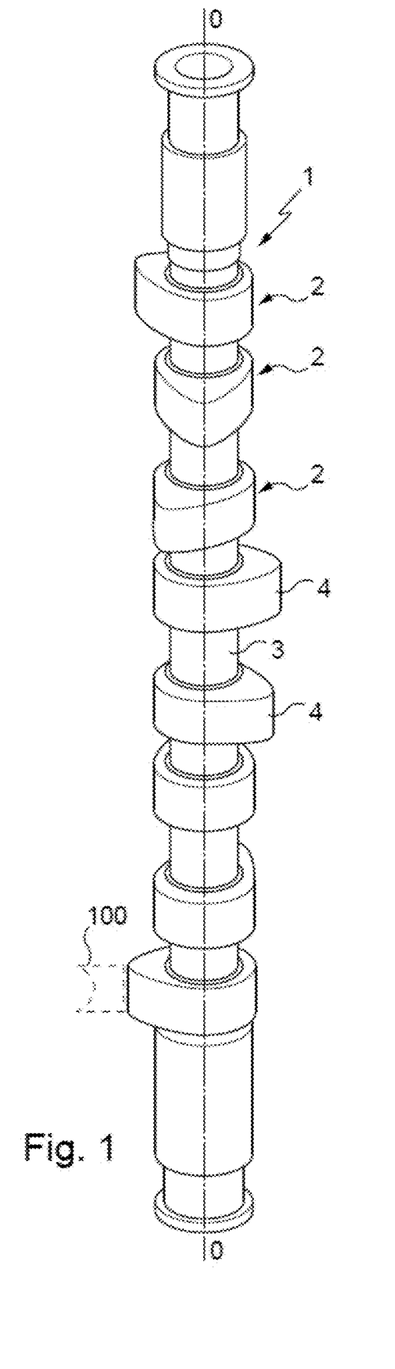
FIG. 1 is a perspective view of a camshaft according to the invention.

FIG. 1 shows a camshaft, denoted with the reference 1, formed from the assembly of a plurality of cams 2 engaged on a common shaft 3, each cam having, with respect to an adjacent cam, an angular offset defined as a function of the type of internal combustion engine with which this camshaft is intended to interact.

According to the invention, only a part 4 of the cams is provided with a protective coating based on amorphous carbon, called DLC ("diamond-like carbon"), advantageously hydrogen-filled. This part 4 corresponds to all or part of the portion usually called the "cam nose", i.e. the elongated part of the cam, as opposed to the rest of the cam, sometimes called the "rear part of the cam", which has, with respect to the axis of the camshaft, a minimal distance, which is in practice constant: in fact, the contour of this rear part is conventionally a portion of a cylinder.

In fact, each cam 2 comprises a cylindrical central opening 5 (see FIG. 2) the centre C of which is intended to be located on axis O-O of the shaft; it is with respect to this centre that the rear portion is a portion of a cylinder (or circular zone) with a radius denoted R. This circular zone extends over an angle of 180° about this axis.

One of the tappets 100 with which the camshaft is intended to interact in service is shown with dashed lines in FIG. 1.

Figure 2:
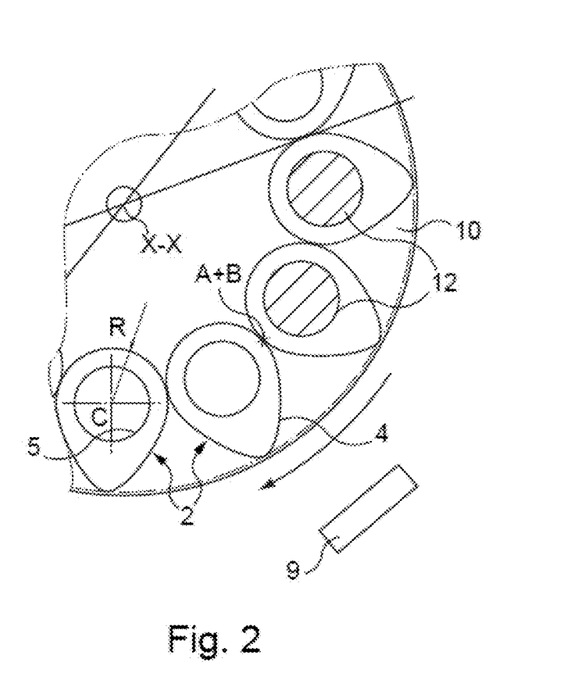
FIG. 2 is a schematic diagram of the method for coating the cams prior to their assembly onto a camshaft such as that in FIG. 1.

FIG. 2 shows, diagrammatically, the method by which the cams 2 are provided, in their zone 4 only, with a protective coating of the DLC type.

These cams 2 are treated individually by presenting this zone 4 to a source for vacuum deposition of a coating material shown diagrammatically as reference 9, of any suitable known type, in practice a carbon source in a facility for physical vapour deposition (abbreviated to "PVD"), advantageously plasma assisted ("plasma enhanced PVD" or "PEPVD"); such a deposit may also be formed by chemical vapour deposition ("CVD" or, if plasma enhanced, "PECVD"). For the sake of simplicity, the chamber adapted to be placed under vacuum for such a deposition is not shown.

To allow simultaneous treatment of a large number of cams, these cams are in practice mounted on a carousel 10 adapted to be rotated in front of the source 9, about an axis denoted X-X. It should, however, be noted that since these cams are not intended to be coated over their entire surface, they do not have any kind of rotary movement with respect to the carousel; this explains why, in contrast to the case where these cams would need to turn with respect to their carousel, in a planetary motion, the cams may, according to the invention, be arranged side by side. In fact, as will be pointed out below in connection with FIG. 5, there is no need to deposit the protective coating beyond the zones where cams arranged side by side come into contact.

It will be understood that the configuration in FIG. 2, where cams are arranged side by side, in contact with one another, corresponds to a configuration of maximum density, i.e. a configuration allowing arrangement of a maximum number of cams on a given carousel so that these cams all have an identical coating treatment. However, in certain cases it may be desirable to have a less dense configuration, with a space between adjacent cams, while remaining within the scope of the invention.

The positioning of the cams on the carousel is in practice provided by a plurality of rods (or cores) 12 parallel to the axis X-X, while being located at one and the same distance with respect to this axis X-X. These rods have the same shape and the same cross section as the circular openings provided in the cams, with a small clearance, which contributes to their good angular positioning. It will be understood that arranging the cams in contact with one another also contributes to holding their angular positioning.

Figure 3:
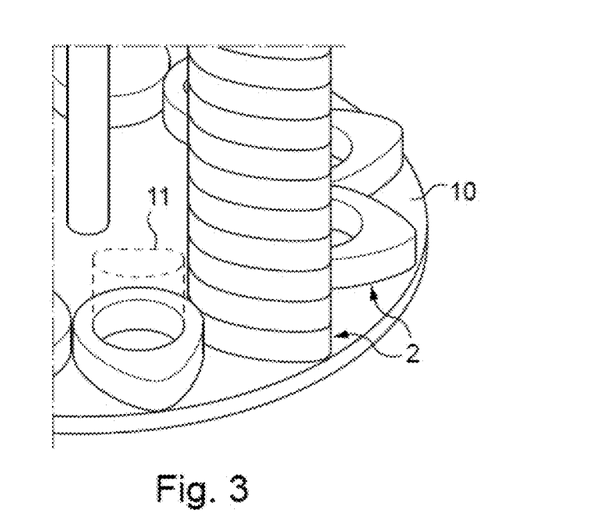
FIG. 3 is a schematic diagram, in perspective, of a carousel suitable for implementing the method in FIG. 2.

Not only can cams be arranged side by side along the periphery of a carousel, but they may moreover be stacked, as shown in FIG. 3.

It will be understood that the number of cams arranged in a plane transverse to the axis of rotation, and the number of cams in each stack, may be freely chosen in relation to the requirements and the available space.

FIG. 2 corresponds to a particularly simple case, where there is a single carousel rotating about its axis. However, this case is not industrially realistic from an economic standpoint; in fact, according to the usual practice in the field of vacuum deposition on components in batches, there is a plurality of carousels identical to the carousel 10, two of which are denoted 10A and 10B in FIG. 4; the carousels are mounted on a general tray denoted 15, mounted rotatably about an axis Y-Y, parallel to the axes of rotation of the carousels. In that way, all the cams mounted on the various carousels carried by the tray are brought in their turn opposite the source 9 and so can undergo one and the same coating treatment.

In practice, all the cams have the same composition and the same geometry.

Figure 5:
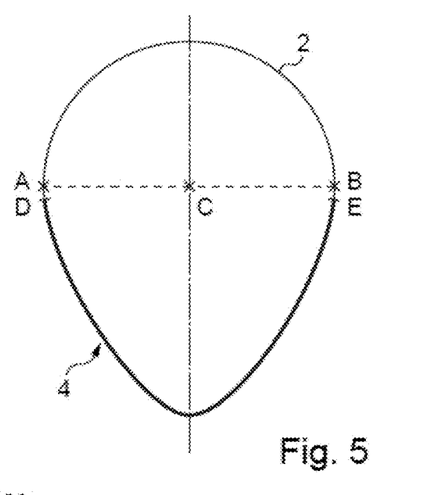
FIG. 5 is a diagram of the contour of a cam such as those in the preceding figures.

FIG. 5 shows the contour of a cam 2. The centre C is shown, but not the central opening. The part known as the back part, with a cylindrical wall, i.e. with a circular contour, is delimited by points denoted A and B, which are diametrically opposite one another. It is in practice at these points that this cam comes into contact with the adjacent cams in the configuration in FIGS. 2 and 3. The coated zone 4 preferably extends "upstream" of these points A and B, i.e. closer to the end of the nose than these points. It can also be seen that the coated zone may stop at points D and E situated at a non-zero distance from these points A and B (this will be commented upon later).

Figure 6:
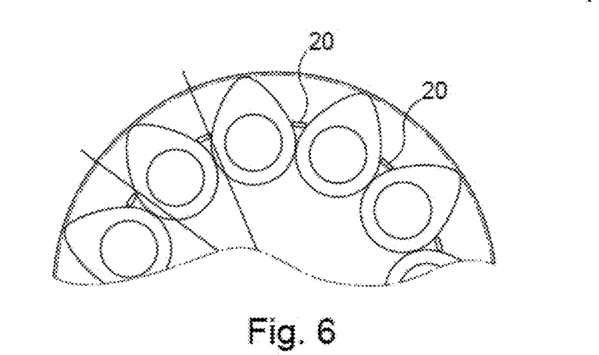
FIG. 6 is a schematic diagram of a variant embodiment of a carousel suitable for implementing the method of the invention.

FIG. 6 shows, partially, a configuration allowing good control of the positioning of the ends of the coated zone on the various cams; this control is achieved by arranging masks 20 between the cams, preventing material being deposited on the cams near points A and B. It will be understood that these masks 20 are arranged at one and the same distance from the axis X-X of the carousel.

It was found that this control of the ends of the coated zone makes it possible to obtain, if this appears desirable, a thickness that does not vary by more than 20% over the whole of the coated zone 4; this may help in particular to prevent loss of adhesion of zones with inadequate thickness.

The thickness of the coating is of the order of a micron, i.e. it is in practice comprised between 1 and 10 microns, preferentially 1 and 5 microns, which makes it possible to classify this coating in the category of thin films; that is why such coatings can be formed by the aforementioned techniques for depositing thin films, of the PVD or PECVD type in particular.

Advantageously, the aforementioned method is supplemented, before or after depositing the aforementioned coating, with a microtexturing step, i.e. with a step in which a relief is formed, over depths of less than a micron (for example a few tenths of a micron), so as to promote spreading of a lubricating fluid beyond the cavities thus created, and therefore optimize lubrication; this microtexturing is carried out on all or part of the surface of the nose of the cams, preferably in the zones of deposition of the coating. This in particular makes it possible to shift the transition between elasto-hydrodynamic conditions and mixed conditions towards harsher operating conditions. Conditions for the formation of such a microtexturing are in particular described in document WO 2008/047062.

It should be noted that the coating does not have to be present on the section of the cams, apart from their nose, nor on their surfaces transverse to their axis of translation (which do not participate in any friction contact).

By way of example, the method described above was carried out on cams made of low-alloy carbon steel, more specifically 10006 steel (1% carbon and 1.5% Cr); of course, the invention may be applied to many other steel grades whether alloyed or not, without limitation as to the conditions under which they are obtained (thus, it applies, in particular, in the field of powder metallurgy); of course, the material is chosen taking into account the desired level of hardness for the chosen application and its compatibility with the coating process. They were treated utilizing the configuration in FIGS. 2 and 3. The particular conditions stated below are only mentioned by way of example, in connection with cams the rear part of which has a radius of 16.50 mm (which is sufficient to define, on the basis of the drawings, the rest of the geometry of these cams).

More specifically, after cleaning the cams by any method known to a person skilled in the art, they were placed on the carousel in these FIGS. 2 and 3, some being side by side in contact with one another, others being stacked. The carousel thus loaded with cams was put into the treatment chamber under vacuum During pumping to obtain the required level of vacuum, the chamber, the carousel and the cams were degassed by radiative heating at a temperature setting chosen to be at a level below the tempering temperature of these various components (such a choice is within the capability of a person skilled in the art), which makes it possible to avoid any deterioration in the mechanical properties of the steel.

When the vacuum reached a satisfactory value, in this case $2 \cdot 10^{-5}$ mbar, argon was introduced into the chamber to give a pressure of the order of $10^{-3}$ mbar, and cleaning was carried out according to suitable cleaning parameters (plasma power, bias voltage) to allow removal of the natural oxide layer present on the components, including in the confined zones at the level of the contact between the cams. It is within the capability of a person skilled in the art to adjust these parameters.

After this cleaning, a deposit of tungsten carbide was produced by a magnetron sputtering process. At the end of PVD, the quantity of carbon in the film was gradually increased in order to create a transition layer; a layer of this type is denoted WCC. A deposit of the hydrogenated amorphous carbon type was finally produced by a PECVD process.

This sub-layer of WCC is only mentioned by way of example; other sub-layers may also be used for good adhesion of DLC, for example of CrN, or Cr+WCC in particular. The presence of such a sub-layer is only optional, depending on the nature of the material of the surface zone of the cam.

Under these conditions, a coating was obtained having satisfactory adhesion starting from a distance of 4 mm with respect to the point of contact A or B between the two cams. The measured thickness of this coating varied in a range of barely ±20% starting from a distance of 8 mm with respect to this same point of contact. It was observed that there was complete absence of coating on the rear part of the cams, i.e. on the parts the contours of which, such as the contour AB in FIG. 5, are circular.

By way of example, measurements of adhesion and thickness were carried out on a cam treated as stated above, in different positions with respect to the point of contact A or B; these positions are calculated from these points A or B, which therefore have a reading of 0 mm.

The adhesion tests are carried out according to standard VDI3198, and the thickness measurements are carried out by Calotest.

|  | Distance with respect to the point of contact | | | | | |
|---|---|---|---|---|---|---|
|  | 0 mm | 3 mm | 5 mm | 8 mm | 10 mm | 15 mm |
| Adhesion | not measurable discharge | HF6 | HF1 | HF1 | HF1 | HF1 |
| Thickness |  | 1 µm total | 0.5 + 1.5 µm | 0.7 + 2.2 µm | 0.8 + 2.4 µm | 0.8 + 2.7 µm |

It can be seen that only traces of the coating are found at the level of points A or B, that the coating is barely of the order of a micron at 3 mm from these points, but there is a significant thickness starting from 5 mm, which reaches a maximum beyond 10 mm. In other words, the coating has a thickness close to the order of 2-3 microns up to a distance of 5 mm from the contact points and extends, admittedly with a thickness that decreases rapidly, up to 3 mm from these points. A satisfactory DLC coating was therefore obtained, on the nose of the cam, leaving bare the rear thereof, which confirms the efficacy of the choice of having no movement of the cams with respect to the carousel during the coating step. To be precise, the coating obtained was, in the example described above, a coating complying with the commercial designation Certess DDT, i.e. a hydrogen-containing DLC (type a-C:H—see document WO 2012/156746). Of course, this is just one possible example of coating herein; the presence of hydrogen is not indispensable; moreover, when it is present, the concentration of hydrogen may be chosen depending on the requirements.

A person skilled in the art is able to optimize assembly of the components, and the parameters for cleaning and then deposition, in relation to the particular requirements and the underlying materials.

According to another example, steel cams with an outside diameter of 33 mm (in the main cam) and a length of 41.6 mm (i.e. identical to those in the first example) were coated with a DLC coating, utilizing the configuration in FIG. 6, with masks 20 situated about 5 mm from the contact points A and B; this made it possible to obtain a coating that stops cleanly, substantially in the extension of the masks.

The cams went through the same procedure (cleaning, placing under vacuum, degassing, cleaning and deposition) as in the first example. It was found that the coating obtained in this way had a thickness that did not vary by more than 20% over the surface exposed to the source of coating material (the rest of the section of the cams being devoid of any coating).

It is thus confirmed that adding an additional component to define the end of the coated zone gives a coating that is adherent and has a uniform thickness over the entire zone affected by the DLC coating. A person skilled in the art is able to adjust the position of the masks depending on the requirements, with respect to the distance of points A and B from the axis of the carousel.

The gain in fill factor for a given facility for depositing a DLC coating can be well understood by noting that, in industrial deposition equipment denoted by the reference TSD 850 made by the company HEF Durferrit, it was possible to achieve a gain of the order of 30% to 50% on this fill factor. In this comparison the components had the dimensions considered previously (diameter of 33 mm, length of 41.60 mm and thickness of 9.3 mm).

Moreover, in relation to the production of a coating of 3 microns on the entire outer surface of the cams, by means of such a machine TSD 850 with rotation of the cams with respect to the carousels, it was possible to obtain one and the same coating limited to all or part of the nose of these cams (without rotation of the cams with respect to the carousels), with a reduction in cycle time of the order of 35%.

Figure 7:
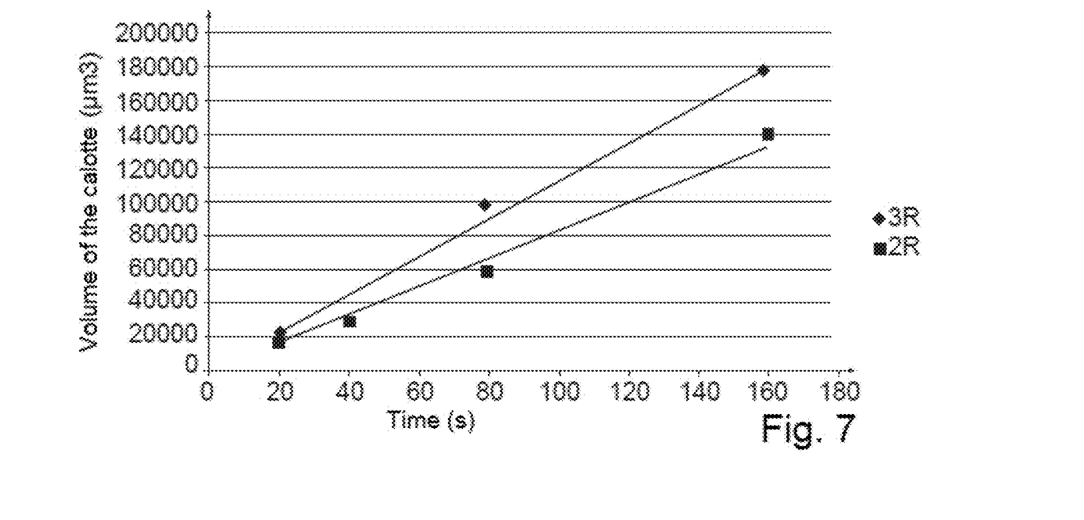
FIG. 7 is a graph showing the volume of wear as a function of time, for coatings obtained with double or triple rotation.

FIG. 7 illustrates the improvement supplied by the invention in terms of wear rate; it presents the results of a "Calotest" wear test carried out on two types of components coated with hydrogen-filled DLC. These components were, respectively: coated over their entire lateral surface (360° with triple rotation)—denoted by the symbol 3R—and coated over an angular fraction of their surface (owing to absence of rotation with respect to the carrying carousel)—denoted by the symbol 2R.

It can be seen in FIG. 7 that the component coated under double rotation according to the invention has a lower wear rate than that coated over its entire lateral surface.

Microhardness tests were carried out on cylindrical components provided with the aforementioned coating applied under triple rotation (3R), or in double rotation, according to the invention (2R). The results are presented in the following table.

|    |         | $H_{IT}$ (GPa) | HV0.02 | E* (GPa) |
|----|---------|---------------|--------|----------|
| 2R | Diam 28 | 29.7          | 2756   | 263.2    |
|    | Diam 20 | 27            | 2501   | 243.4    |
| 3R | Diam 24 | 27.3          | 2533   | 211.1    |
|    | Diam 18 | 25.1          | 2326   | 214.2    |

It can be seen that for comparable diameters, the characteristics of the coating produced under the double rotation configuration are superior to those of the coating produced under the triple rotation configuration. These data corroborate the results of the wear test. It should be understood that the range of diameters mentioned in the above table is in no way limitative and that the invention can be applied to smaller or conversely on larger components.

From the standpoint of hardness, it may be said that in the case of the triple rotation configuration, the hardness (and therefore the resistance to abrasive wear) of the coating produced tends to decrease. This decrease can be compensated by adjusting the deposition parameters, but only up to a certain point. In fact, adjustment of these parameters is reflected in an increase in the temperature reached by the components during coating. Now, these mechanical components very often originate from case-hardened steels, which cannot withstand temperatures that are too high. In general, it seems advisable to carry out deposition at a temperature below 220° C., or even below 200° C.

Figure 8:
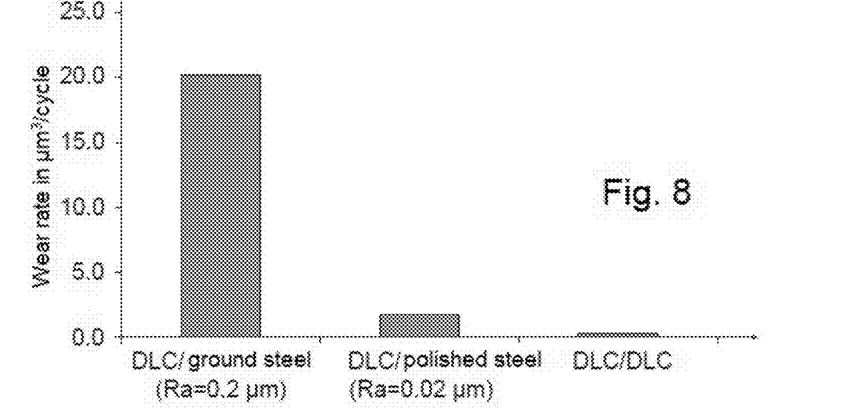
FIG. 8 is a graph correlating the wear rate with the nature of the materials present on the surface on two opposing parts of the cam/tappet type.

The effectiveness of the invention for minimizing the degradation of the DLC coating in the presence of oils containing MoDTCs can be seen in FIG. 8, which presents the wear rates found in ball-on-flat friction tests in an oil containing MoDTCs, for three pairs of materials in friction contact, with the following parameters:

Applied load: 10N
Linear speed: 35 mm/s
Mode: eccentric
Number of cycles: 15000
Radius of sphere: 5 mm
Offset: 10 mm
Oil temperature: 110° C.
Nature of the ball: steel, DLC-coated It can be seen that, with a pair of two components each comprising a DLC coating, the wear rate is nearly 70 times lower than that obtained in the case of a DLC-coated ball/ground steel pair (which corresponds to the conventional configuration of a coated tappet combined with a steel cam).

Figure 9:
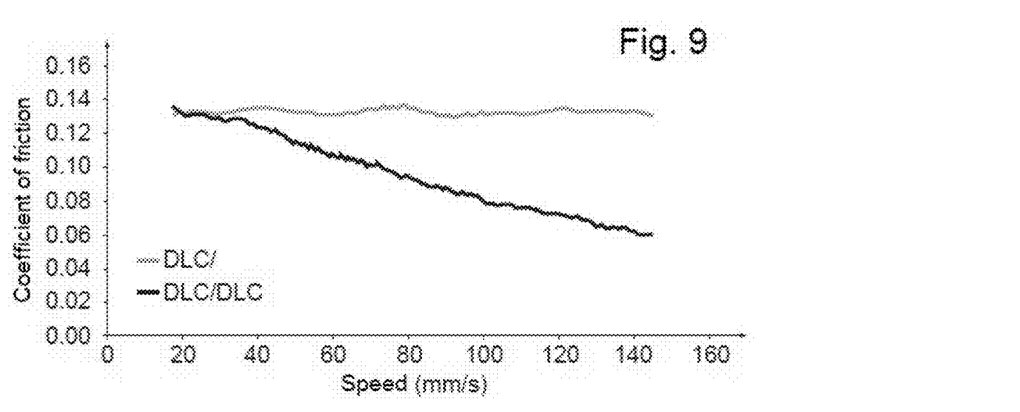
FIG. 9 is a graph correlating the coefficient of friction with the speed of relative movement, for two pairs of materials present, on the surface, on two opposing parts.
Figure 10:
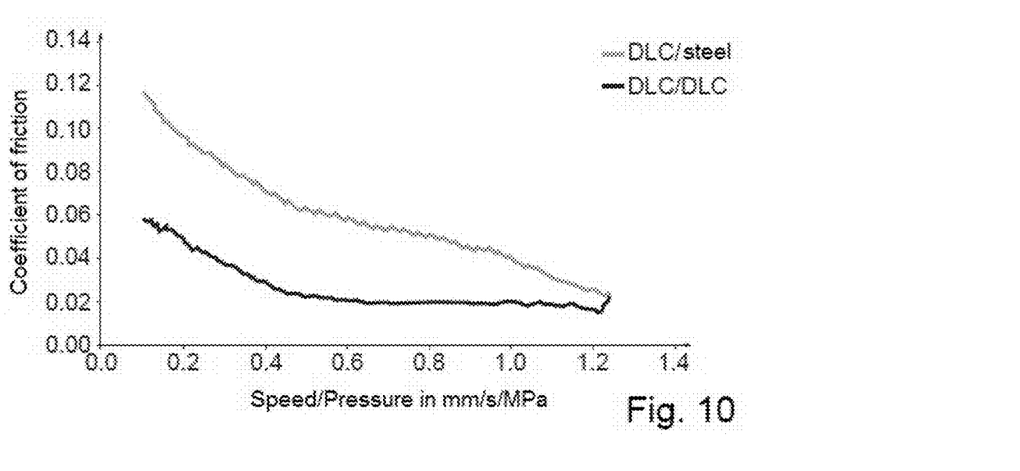
FIG. 10 is a graph correlating the coefficient of friction with the speed/pressure ratio, for the two pairs of materials present, on the surface, on the two opposing parts in FIG. 9.

Finally, FIGS. 9 and 10 illustrate the advantage of the invention in terms of a decrease in the coefficient of friction, based on friction tests in the cylinder/flat configuration with the following parameters:

with polished cylinder and flat (Ra=0.02 μm),
after a running-in phase of 18 000 cycles,
under a constant load of 21N.

At the start of the test, during the running-in phase, under limit conditions of lubrication, the coefficients of friction are identical in the case of a DLC-coated steel/steel friction pair and for a DLC-coated steel/DLC-coated steel friction pair. At the end of the running-in, it can be seen that the DLC-coated steel/steel pair has a constant coefficient of friction regardless of the speed, indicating that limit conditions of lubrication still obtain.

The DLC-coated steel/DLC-coated steel pair has the same coefficient of friction for speeds below 35 mm/s. Above this speed, the coefficient of friction decreases when the speed increases, indicating transition to mixed lubrication conditions.

Under identical operating conditions, the DLC-coated steel/DLC-coated steel pair displays lower coefficients of friction much more quickly.

Once mixed conditions are reached (higher speed/greater load), the DLC-coated steel/DLC-coated steel pair has lower values of coefficient of friction than the DLC/steel pair (see FIG. 10).

It will be appreciated that the invention offers an economic advantage in the production of the DLC coating on the cam. Moreover, by applying the coating partially onto the cam, the thickness of said coating can be increased, while preserving its good mechanical properties, and while still advantageous from an economic standpoint.

Surprisingly, the deposit produced in this configuration (double rotation) has better properties than the integral deposit produced in a triple rotation configuration.

In the case of the DLC-coated steel/DLC-coated steel contacts, this solution shows large decreases in friction and wear of the coated components (cam/finger follower or cam/tappet). Moreover, it can prevent any accelerated degradation of the DLC coating caused by the use of oils with additives, in particular containing compounds of the MoDTC type.

In the case where the contact presents limit lubrication, retaining the oil in the most stressed zone of the contact is ensured by the difference in wettability between the coated and uncoated zones.

In the case of cam/finger follower contacts, roller finger followers are commonly used, which involve mild cam regimes. This solution makes it possible to withstand the more aggressive regimes applied for slipper followers, while maintaining low friction losses. Furthermore, the transfer to slipper follower technology also contributes gains in fuel consumption, owing to the reduction in weight of the system and cam regime as such.

Figure 4:
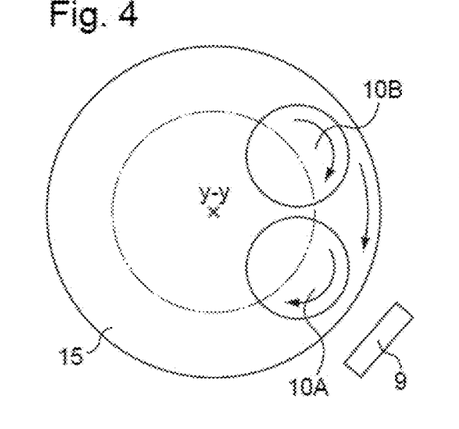
FIG. 4 is a schematic diagram of a treatment facility comprising a carousel such as that in FIG. 3.

The edge of each of the carousels constitutes a reference line for this carousel, and, in the configuration in FIG. 2 (with a single carousel having a fixed axis) as well as in the configuration in FIG. 4 (with several carousels having axes of rotation carried by a rotating tray), it may be assumed that the cams that are just opposite the source of coating material have a path that is parallel (concentric) to this reference line.

Figure 11:
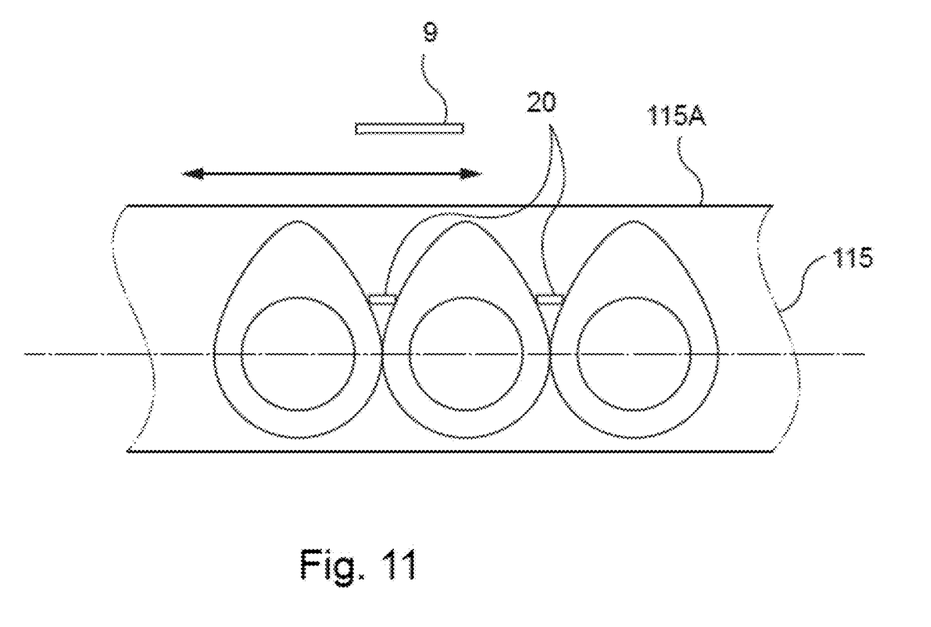
FIG. 11 is a schematic diagram of the method for coating the cams (prior to their assembly onto a camshaft), according to a variant of FIG. 2 in which the movement is a translation.

It is important to note that a limiting case of the invention, when the centre of rotation approaches infinity, corresponds to a translational movement. FIG. 11 is a variant of the configuration shown above in FIGS. 2 and 4, showing cams mounted on a tray 115, parallel to a reference straight line constituted by the edge 115A of the tray; this tray is driven with a translational movement in front of the source of coating material (denoted by the same reference 9 as in FIG. 2); this movement, according to the path indicated by the arrow F, may be strictly rectilinear or may have a slight curvature, depending on the available space. The translational movement may be a continuous or alternating movement; the advantage of an alternating movement is that it allows each cam to pass in front of the source of coating material several times; it will, however, be understood that, provided that the at least approximately rectilinear path of the tray is joined, at a distance from the source, to portions of path that are semicircular, the tray may follow a flattened loop, in a continuous movement.

In this configuration with translational movement, there may be only a single tray carrying all the cams to be treated, and not two supports as in the case in FIG. 4.

Masks 20 may also be provided here for good delimitation of the fraction of the sections of the cams that is coated.

In the examples shown, the edges have a simple geometric shape, circular in the case in FIG. 2 (centred on the axis of rotation of the carousel) or rectilinear in the case in FIG. 11; depending on the requirements, this edge can be envisaged as having undulations in its plane, for example to minimize the material between adjacent rods. In such a case the reference line may be defined by the simplest geometric line that runs along such an edge.

According to yet another variant (not shown), the source of coating material 9 is not arranged laterally (i.e. horizontally) with respect to the support of the cams, but above the latter; thus, the cams may be engaged on horizontal rods, parallel to the tray that acts as their support, with their noses pointing upwards.

Conversely, the source may be arranged below the cams, the cams being engaged on rods situated under the tray, in an orientation in which their noses point downwards, simply by gravity.

According to yet another variant, the rods may be arranged in an inclined direction, provided that the cams are arranged on the support according to a defined fixed configuration, jointly with the path of travel, in such a way that the cams are brought successively opposite the coating source with substantially identical orientations and at substantially identical distances with respect to this source, so as to deposit a coating selectively on the fractions of the sections of the cams that are oriented towards said source.

Once again, the cams may be associated with masks as before.

According to yet another variant, the carousel in FIG. 2 or 4 may be oriented so as to turn about an axis that is non-vertical, horizontal, o inclined at a non-zero angle with respect to the horizontal and to the vertical.

The above orientations and distances may be only "substantially" identical, meaning that if the source does not have the same dimension, transversely to the path of travel, as the plurality of cams, the cams situated at the periphery of the plurality may receive coating material at slightly different orientations than for the cams arranged in the middle of the plurality, and may be at slightly larger distances than the cams located in central position. In practice, these orientations are identical to within at most 5° and the distances are identical to within at most 5%.

In the foregoing, the movement between the cams and the source is relative, meaning that whereas in the examples described the cams move with respect to a fixed source, the invention also covers the case of a source moving with respect to a plurality of fixed cams.

In general, it may be noted that the invention makes it possible to coat, selectively and in a controlled manner, only a part of the section of the cams (the coating is present where it is desired but not where it is not needed), in a sufficiently simple manner so as not to cause a significant extra cost, with respect to a conventional technique with 100% coating, and thus take advantage of the reduction in the quantity of coating material. Furthermore, no finishing is required before the cams are brought into service.

The invention claimed is:

1. A method for treating cams of a camshaft for a vehicle with an internal combustion engine in order to reduce a friction thereof with respect to an opposing part in a zone provided with a hard coating based on amorphous carbon of diamond-like carbon or DLC type, the cams having a central opening and a section that has a circular zone and an elongated portion forming a nose having a length defined by a maximum dimension measured from the nose to the circular zone, the method comprising:
    arranging the cams on a support,
    bringing the support into a chamber that is put under vacuum so as to ensure cleaning of the cams,
    putting the support in a relative movement following a path of travel relative to a coating source for a vacuum deposition of the hard coating based on the amorphous carbon of the diamond-like carbon or DLC type, and
    removing the cams from the support before the cams are assembled onto the camshaft,
    wherein the support comprises a plurality of rods positioned parallel with respect to one another at a same distance from the path of travel so as to be oriented perpendicularly to a direction of emission of the coating source when the rods are brought opposite thereto,
    wherein the cams are arranged on the support according to a fixed and dense configuration by passing the rods through the central openings of the cams, the rods being distributed regularly along the path of travel such that the cams engaged on one of the rods are at least approximately in contact with the cams engaged on rods nearest the one rod, and
    wherein the fixed and dense configuration and the path of travel are defined such that the cams are brought, along the path of travel, successively opposite the coating source with substantially identical orientations and at substantially identical distances with respect to the coating source, so as to deposit the coating selectively on fractions of the sections of at most the nose of the cams that are oriented towards said coating source.

2. The method according to claim 1, in which the support is a carousel having an axis of rotation, and the cams are arranged on the carousel so as to align a length of the cams along a radii of the carousel, the cams being at a same distance from the axis of rotation, and the movement applied to the carousel is a rotation about said axis of rotation.

3. The method according to claim 1, in which the support has a rectilinear path of travel, and the cams are arranged on the support so as to align a length of the cams parallel to one another, the cams being at a same distance from the path of travel.

4. The method according to claim 1, further comprising arranging masks on the support,
all of the masks being arranged at a same distance with respect to a surface defined by a set of the rods during the relative movement with respect to the coating source alternating with the rods, so as to be in front of the rods in the direction of the coating source when the rods and the cams arrive opposite the coating source, so as to mask, with respect to the coating source, zones of the cams where the sections of the cams are opposite adjacent cams.

5. The method according to claim 4, in which the masks have, parallel to said surface defined by the rods, a dimension extending from a surface of the cams engaged on one of the rods to a surface of the cams engaged on an adjacent rod, to within a clearance.

6. The method according to claim 4, in which the support is a carousel having an axis of rotation, and a distance to an axis of the masks has a value of between 100% and 150% of a distance of an axis of the rods with respect to the axis of the masks.

7. The method according to claim 6, in which the distance to the axis of the masks has a value of between 110% to 130% of the distance of the axis of the rods with respect to the axis of the masks.

8. The method according to claim 1, in which the coating based on the amorphous carbon with a composition containing from 20 to 50 at % of hydrogen is deposited.

9. The method according to claim 8, in which said coating contains from 20 to 30 at % of hydrogen.

10. The method according to claim 1, in which, prior to deposition of the coating based on the amorphous carbon, a sub-layer is formed in tungsten carbide, chromium carbide, a mixture of tungsten and chromium carbides, and/or a nitride.

11. The method according to claim 1, in which a micro-textured surface is formed on all or part of the nose of the cams, before or after formation of the coating based on the amorphous DLC carbon.

12. A cam obtained by the method according to claim 1, in which only a part of the section is provided with the coating based on the amorphous diamond-like carbon.

13. A camshaft comprising cams obtained by the method according to claim 1, in which only a part of the section, representing at most the nose of the cams, is provided with the coating based on the amorphous diamond-like carbon.

14. The camshaft according to claim 13, in which the sections of the cams are only provided with said coating up to a distance, with respect to the ends of the circular zone of the cams, that has a value of at least 30% of the radius of the circular zone of the cams.

15. The camshaft according to claim 13, having micro-texturing in all or part of a zone of the section provided with said coating.

16. A motorization assembly comprising the camshaft according to claim 13 and a plurality of tappets or finger followers interacting respectively with the cams, each of the tappets or finger followers having a contact surface provided with the coating based on the amorphous diamond-like carbon.

17. A device comprising:
the camshaft according to claim 13;
a plurality of tappets or finger followers interacting respectively with the cams, each of the tappets or B finger followers having a contact surface provided with the coating based on the amorphous diamond-like carbon; and
an oil containing friction-reducing additives based on sulfur and molybdenum.

18. A coating treatment facility for implementing the method of claim 1, comprising a source of the coating material, and the support able to be moved in front of the source of the coating material following the path of relative travel,
the support comprising the plurality of rods parallel to one another,
the rods being fixed with respect to the support and distributed regularly at the same distance from the path of travel so as to be oriented perpendicularly to the direction of the emission of the source of the coating material when the rods arrive opposite the source of the coating material, and a spacing between the rods allowing the cams to be engaged on the rods, being oriented according to a same configuration with respect to the path of travel, noses of the cams being oriented towards the source of the coating material when the rods arrive opposite the source of the coating material.

19. The coating treatment facility according to claim 18, in which the support is a carousel that is able to turn about an axis of rotation in front of the source of the coating material.

20. The method according to claim 1, in which, prior to deposition of the carbon-based coating, a sub-layer is formed in tungsten carbide, chromium carbide, or a mixture of tungsten and chromium carbides.

* * * * *